United States Patent
Yang

(10) Patent No.: US 11,404,661 B2
(45) Date of Patent: Aug. 2, 2022

(54) OLED DISPLAY PANEL AND MANUFACTURING METHOD THEREOF

(71) Applicant: Wuhan China Star Optoelectronics Semiconductor Display Technology Co., Ltd., Hubei (CN)

(72) Inventor: Lin Yang, Hubei (CN)

(73) Assignee: Wuhan China Star Optoelectronics Semiconductor Display Technology Co., Ltd., Hubei (CN)

( * ) Notice: Subject to any disclaimer, the term of this patent is extended or adjusted under 35 U.S.C. 154(b) by 365 days.

(21) Appl. No.: 16/632,042

(22) PCT Filed: Nov. 14, 2019

(86) PCT No.: PCT/CN2019/118592
§ 371 (c)(1),
(2) Date: Jan. 17, 2020

(87) PCT Pub. No.: WO2021/035982
PCT Pub. Date: Mar. 4, 2021

(65) Prior Publication Data
US 2021/0408443 A1 Dec. 30, 2021

(30) Foreign Application Priority Data
Aug. 27, 2019 (CN) .......................... 201910796432.0

(51) Int. Cl.
*H01L 51/52* (2006.01)
*H01L 51/00* (2006.01)
*H01L 51/56* (2006.01)

(52) U.S. Cl.
CPC ...... *H01L 51/5237* (2013.01); *H01L 51/0034* (2013.01); *H01L 51/56* (2013.01); *H01L 2251/303* (2013.01); *H01L 2251/5369* (2013.01)

(58) Field of Classification Search
CPC ................................................. H01L 51/5237
See application file for complete search history.

(56) References Cited

U.S. PATENT DOCUMENTS

2017/0101538 A1* 4/2017 Kubo ................... C09D 125/06
2019/0027414 A1 1/2019 Ramadas et al.
2019/0067643 A1 2/2019 Zhai et al.
(Continued)

FOREIGN PATENT DOCUMENTS

CN 104039544 A 9/2014
CN 104183742 A 12/2014
(Continued)

*Primary Examiner* — Douglas M Menz
(74) *Attorney, Agent, or Firm* — Luedeka Neely Group, PC

(57) ABSTRACT

An organic light-emitting diode (OLED) display panel and a manufacturing method thereof are provided. An organic material and an inorganic nano-particle material are placed in a crucible under a high-pressure gas after vacuuming, the inorganic nanoparticles and the organic material are highly uniformly mixed during an evaporation process, and an encapsulation layer is formed integrally into one piece by adjusting an evaporation rate ratio of the organic material to the inorganic nano-particle material. The film layer stability and transmittance are optimized, and the inorganic nanoparticles are uniformly distributed, thereby improving the light transmittance of the OLED display panel.

13 Claims, 2 Drawing Sheets

(56) References Cited

U.S. PATENT DOCUMENTS

2019/0140214 A1\* 5/2019 Kim .................... H01L 51/004
2020/0028116 A1   1/2020 Yang

FOREIGN PATENT DOCUMENTS

| CN | 106876598 A | 6/2017 |
|---|---|---|
| CN | 107546338 A | 1/2018 |
| CN | 109065747 A | 12/2018 |
| CN | 209216977 U | 8/2019 |
| WO | 2017164451 A1 | 9/2017 |

\* cited by examiner

OLED DISPLAY PANEL AND MANUFACTURING METHOD THEREOF

FIELD OF INVENTION

The present application relates to a field of display technologies, and in particular, to an organic light-emitting diode (OLED) display panel and a manufacturing method thereof.

BACKGROUND OF INVENTION

Flexible organic light-emitting diode (OLED) is a deformable and flexible display device, which has advantages, such as self-lamination, wide viewing angles, high contrast, low power consumption and high response times, compared with conventional rigid display.

Generally, the flexible OLEDs adopt thin film encapsulation (TFE) technology, and encapsulation films are generally an inorganic/organic/inorganic multilayer film stacked structure. Organic material needs to be mixed with inorganic metal oxide particles, and the organic material and the inorganic metal oxide particles are mixed into a solution, and are prepared into a high refractive index and transmittance encapsulation layer by chemical vapor deposition. The metal oxide powder is easily unevenly distributed in the organic material to form agglomerations, such that uniformity of the encapsulation layer is poor, and light transmission rate is greatly reduced. The mixed metal oxide particles increase a viscosity of the organic solution, which affects the quality of the encapsulation layer.

In summary, in a method for manufacturing a high refractive index and transmittance encapsulation layer of an OLED display panel in the prior art, a solution is used by a chemical vapor deposition process, there are the technical problems that the metal oxide powder is unevenly distributed in the organic material to form agglomerations, such that uniformity of the encapsulation layer is poor, light transmittance of the OLED display panel is low, and the mixed metal oxide particles increase a viscosity of the organic solution, which affects the quality of the encapsulation layer.

SUMMARY OF INVENTION

An object of the present invention is to provide an organic light-emitting diode (OLED) display panel and a manufacturing method thereof, which can solve technical problems that in a method manufacturing for a high refractive index and transmittance encapsulation layer of an OLED display panel in the prior art, a solution is used by a chemical vapor deposition process, and the metal oxide powder is unevenly distributed in the organic material to form agglomerations, such that uniformity of the encapsulation layer is poor, light transmittance of the OLED display panel is low, and the mixed metal oxide particles increases a viscosity of the organic solution, which affects the quality of the encapsulation layer.

In order to solve the above-mentioned problems, an embodiment of the present application provides an organic light emitting diode (OLED) display panel, including: a substrate; a driving circuit layer located on a surface of the substrate; a functional layer located on a surface of the driving circuit layer; and an encapsulation layer including a uniformly distributed inorganic particle material and an organic material, a refractive index of the inorganic particle material being greater than a refractive index of the organic material.

In an embodiment, the inorganic particle material is one or more material selected from a group consisting of zirconium dioxide, titanium dioxide and calcium nitride.

In an embodiment, the organic material includes a pre-polymer polymer.

In an embodiment, a thickness of the encapsulation layer ranges from 300 nm to 20 μm.

In an embodiment, a mass fraction of the inorganic particle material in the encapsulation layer ranges from 0.01% to 20%.

In order to solve the above-mentioned problem, an embodiment of the present application further provides a manufacturing method of an organic light emitting diode (OLED) display panel, including:

a step S10 of providing a substrate, and sequentially preparing a driving circuit layer and a functional layer on the substrate.

a step S20 of placing an inorganic particle material, a pre-polymer, a crosslinking agent, and a photoinitiator in a crucible to form an evaporation gas by utilizing an evaporation apparatus.

a step S30 of sputtering the evaporation gas to an evaporation region in a pre-set evaporation rate.

a step S40 of simultaneously irradiating a surface of the functional layer with a light beam, wherein the evaporation gas is sputtered onto the surface of the functional layer to form an encapsulation layer.

a step S50 of annealing the substrate, the driving circuit layer, the functional layer and the encapsulation layer after the encapsulation layer is formed, and then cooling to the room temperature.

In an embodiment, the pre-polymer is one or more selected from a group consisting of vinyl chloride, propylene, and styrene.

In an embodiment, the crosslinking agent includes N,N'-methylenebisacrylamide.

In an embodiment, the photoinitiator is one or more selected from a group consisting of a BASF photoinitiator, benzophenone, and 2-butanone acid.

In an embodiment, the pre-polymer is polymerized under conditions of the crosslinking agent, the photoinitiator, an ultraviolet light, a high temperature and a high pressure to form a pre-polymer polymer.

In an embodiment, the encapsulation layer includes a uniformly distributed inorganic particle material and a pre-polymer polymer.

In an embodiment, the step S20 of placing the inorganic particle material, the pre-polymer, the crosslinking agent, and the photoinitiator in the crucible to form the evaporation gas by utilizing the evaporation apparatus specifically includes:

separately placing the inorganic particle material, the pre-polymer, the crosslinking agent and the photoinitiator in four crucibles to form four evaporation gases.

In an embodiment, the step S30 of sputtering the evaporation gas to the evaporation region in the pre-set evaporation rate specifically includes:

setting a preset evaporation rate ratio of the inorganic particle material and the pre-polymer ranging from 1:5 to 1:1000.

In an embodiment, setting a preset evaporation rate ratio of the photoinitiator and the pre-polymer ranging from 1:8 to 1:25; and In an embodiment, setting a preset evaporation rate ratio of the crosslinking agent and the pre-polymer ranging from 1:10 to 1:50.

In an embodiment, the step S20 of placing the inorganic particle material, the pre-polymer, the crosslinking agent, and the photoinitiator in the crucible to form the evaporation gas by utilizing the evaporation apparatus specifically includes:

placing the inorganic particle material, the pre-polymer, the crosslinking agent, and the photoinitiator in one crucible to form a mixed evaporation gas.

In an embodiment, the step S30 of sputtering the evaporation gas to the evaporation region in the pre-set evaporation rate specifically includes:

evaporating evaporation gases of the inorganic particle material, the pre-polymer, the crosslinking agent, and the photoinitiator to a same evaporation region.

In an embodiment, the step S40 of simultaneously irradiating the surface of the functional layer with the light beam, wherein the evaporation gas is sputtered onto the surface of the functional layer to form the encapsulation layer specifically includes:

selecting the light beam from one or more of a group consisting of ultraviolet light, near-infrared light, and visible light, wherein the light beam catalyzes a polymerization reaction of the pre-polymer which is then cured to form the encapsulation layer.

In an embodiment, the step S50 of annealing the substrate, the driving circuit layer, the functional layer and the encapsulation layer after the encapsulation layer is formed, and then cooling to the room temperature specifically includes:

setting an annealing treatment temperature ranging from 50 to 80° C., and an annealing time ranging from 2 to 10 minutes.

In an embodiment, a length of the functional layer is smaller than a length of the driving circuit layer, and the encapsulation layer covers the functional layer and a surface of the driving circuit layer adjacent to the functional layer.

The beneficial effects of the present application are: by using an evaporation apparatus, an organic material and an inorganic nano-particle material are respectively placed in different crucibles to form a high-pressure gas, and are uniformly mixed during evaporation to a functional layer, preventing increase in a viscosity of organic material solution due to addition of the inorganic nanoparticles, thereby improving the quality of the an encapsulation layer formation. A surface of the functional layer is irradiated with a light beam, the high-pressure gas forms an encapsulation layer immediately when the high-pressure gas is sprayed onto the surface of the functional layer, and the encapsulation layer stability and transmittance are optimized by adjusting the evaporation rate ratio of the organic material to the inorganic nanoparticle material. The encapsulation layer is formed integrally into one-piece, and the inorganic nanoparticles are uniformly distributed. Organic polymer is present between adjacent inorganic nanoparticles to achieve uniform distribution of the inorganic nano-material. A refractive index of the inorganic nano-particle material is higher than a refractive index of the organic material, so that a light transmittance of the OLED display panel is improved.

DRAWINGS

In order to more clearly illustrate the technical solutions in the embodiments of the present invention, the drawings used in the description of the embodiments will be briefly described below. It is apparent that the drawings in the following description are only some embodiments of the present invention. Other drawings can also be obtained from those skilled in the art based on these drawings without paying any creative effort.

DETAILED DESCRIPTION OF EMBODIMENTS

The present application will be further described in detail below in conjunction with the accompanying drawings and embodiments. It is specifically noted that the following examples are merely illustrative of the present application, but are not intended to limit the scope of the application. In the same manner, the following embodiments are only partial embodiments of the present application, and not all of the embodiments, and all other embodiments obtained by those skilled in the art without creative efforts are within the scope of the present application.

The present application is directed to technical problems that in a method for manufacturing a high refractive index and transmittance encapsulation layer of an OLED display panel in the prior art, a solution is used by a chemical vapor deposition process, the metal oxide powder is unevenly distributed in the organic material to form agglomerations, such that uniformity of the encapsulation layer is poor, light transmittance of the OLED display panel is low, and the mixed metal oxide particles increase a viscosity of the organic solution, which affects the quality of the encapsulation layer. The present embodiment can solve the drawback.

Figure 1:
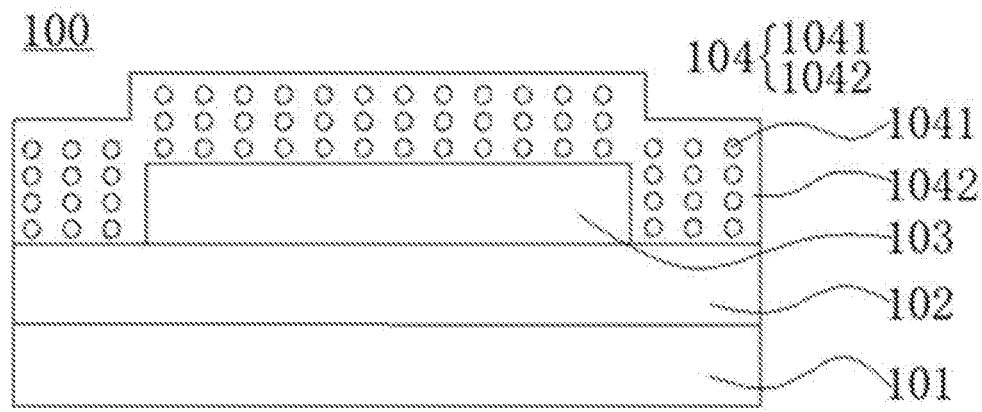
FIG. 1 is a schematic structural view of an encapsulation layer in an organic light emitting diode (OLED) display panel according to an embodiment of the present application.

As shown in FIG. 1, an embodiment of the present application provides an OLED display panel 100 including: a substrate 101; a driving circuit layer 102 located on a surface of the substrate 101; a functional layer 103 located on a surface of the driving circuit layer 102; and an encapsulation layer 104 located on a surface of the functional layer 103 and a surface of the driving circuit layer 102 which is not covered by the functional layer 103. The encapsulation layer 104 includes a uniformly distributed inorganic particle material 1041 and an organic material 1042. A refractive index of the inorganic particle material 1041 is greater than a refractive index of the organic material 1042. In the embodiment of the present application, a length of the functional layer 103 is not limited to be smaller than the driving circuit layer 102. If the length of the functional layer 103 is equal to the length of the driving circuit layer 102, the encapsulation layer 104 only covers the surface of the functional layer 103.

Specifically, the substrate 101 is a flexible substrate, but generally may be a glass substrate. It also may be a substrate made of other materials, and is not limited herein.

The driving circuit layer 102 is located on the surface of the substrate 101, and includes a buffer layer, a driving layer and an indium tin oxide (ITO) layer stacked from bottom to top. The buffer layer is formed on the surface of the substrate 101, and the driving layer is formed on a surface of the buffer layer, and includes a plurality of driving thin film transistors. The driving thin film transistor at least includes a gate electrode, a gate insulating layer, an active layer, and a source/drain layer. The gate insulating layer is formed on the gate electrode layer, the active layer is formed on the gate insulating layer, and the active layer is insulated from the gate layer. The source/drain layer is disposed on both sides of the active layer, the source/drain layer includes a source electrode and a drain electrode, and the source electrode and the drain electrode are respectively electrically connected to corresponding positions of the active layer. The ITO layer includes a pixel electrode that is in electrical connection with the drain electrode of the driving thin film transistor.

The functional layer 103 is located on the surface of the driving circuit layer 102. The functional layer 103 may be a single-layer device structure, a two-layer device structure, a three-layer device structure or a multi-layer device structure. Take the three-layer device structure as an example. The functional layer 103 includes a hole transport layer, an electron transport layer and a luminescent layer.

In the present embodiment, a thickness of the encapsulation layer 104 preferably ranges from 300 nm to 20 μm, the inorganic particle material 1041 is one or more material selected from a group consisting of zirconium dioxide, titanium dioxide and calcium nitride, a thickness of the inorganic particle material 1041 in a film layer is nano-scale, a diameter of the inorganic particle material 104 is less than 100 nm, a light transmittance of the inorganic particle material 1041 and a light transmittance of the organic material 1042 are more than 90%, and a mass fraction of the inorganic particle material 1041 in the encapsulation layer 104 ranges from 0.01% to 20%.

Figure 2:
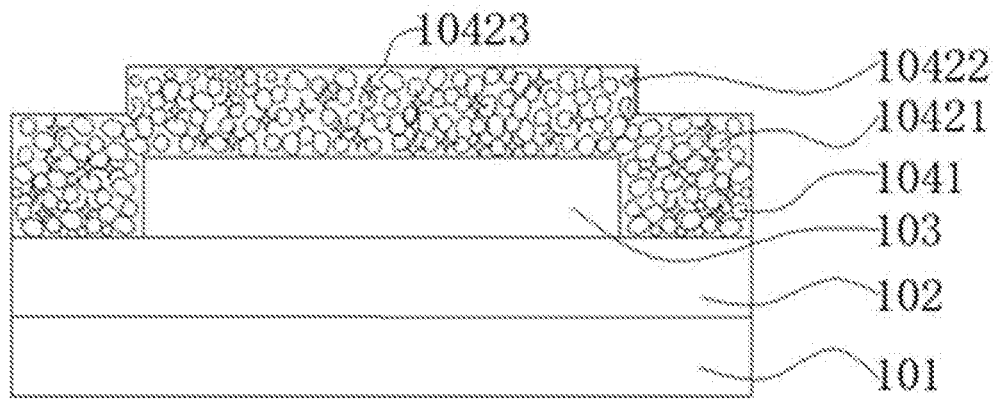
FIG. 2 is a schematic view showing distribution of film formation materials of an encapsulation layer in an OLED display panel according to an embodiment of the present application.

As shown in FIG. 2, an embodiment of the present application provides a schematic view of a film formation material distribution of an encapsulation layer in an OLED display panel. The schematic distribution diagram of the film formation material is a distribution diagram before a polymerization reaction of a pre-polymer 10421 occurred. The encapsulation layer formation material includes the inorganic particle material 1041, the pre-polymer 10421, a crosslinking agent 10422, and a photoinitiator 10423. In a case of high temperature, high pressure and vacuum, the inorganic particle material 1041, the pre-polymer 10421, the crosslinking agent 10422, and the photoinitiator 10423 are in a suspended gas state. The pre-polymer 10421 is one or more selected from a group consisting of vinyl chloride, propylene, and styrene. The crosslinking agent 10422 includes N,N'-methylenebisacrylamide. The photoinitiator 10423 is one or more selected from a group consisting of a BASF photoinitiator, benzophenone, and 2-butanone acid.

Figure 3:
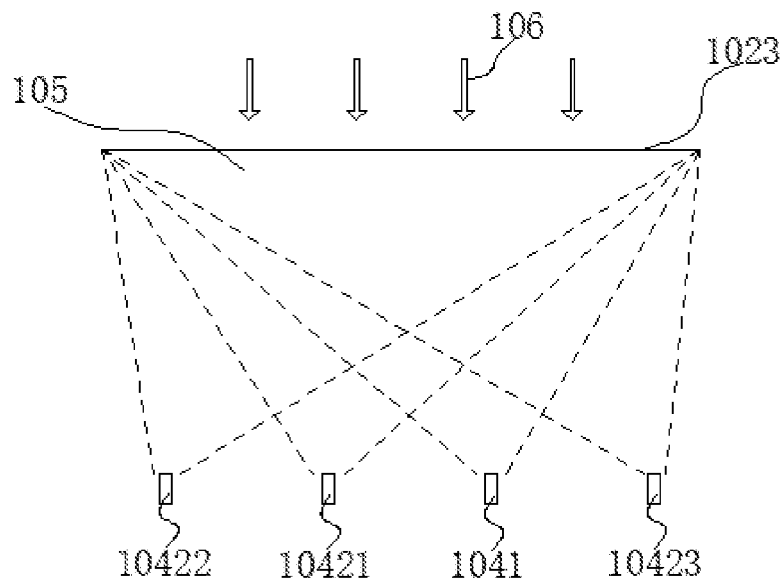
FIG. 3 is a schematic structural view of a film formation process of an encapsulation layer in an OLED display panel according to an embodiment of the present application.

As shown in FIG. 3, the inorganic particle material 1041, the pre-polymer 10421, the crosslinking agent 10422 and the photoinitiator 10423 are separately placing in four crucibles to form four high-pressure gases by using an evaporation device. The four high-pressure gases are uniformly mixed in an evaporation zone 105, the high-pressure gas does not have the material viscosity problem in a solution. When the high-pressure gases are sprayed onto the surface of the driving circuit layer and the functional layer under and the catalysis of an ultraviolet light 106, the crosslinking agent 10422 and the photoinitiator 10423 and under the conditions of vacuum, high pressure and high temperature, the pre-polymer 10421 high-pressure gas is polymerized to form a pre-polymer polymer, the inorganic nano-particle material 1041 is uniformly mixed in the polymer to form the encapsulation layer, and the encapsulation layer is formed integrally into one piece. The inorganic nanoparticles are uniformly distributed, organic material is present between adjacent inorganic nanoparticles, and a refractive index of inorganic nanoparticles is higher than a refractive index of the organic material, thereby improving the film formation quality of the encapsulation layer, and the light transmittance of OLED display panels.

Figure 4:
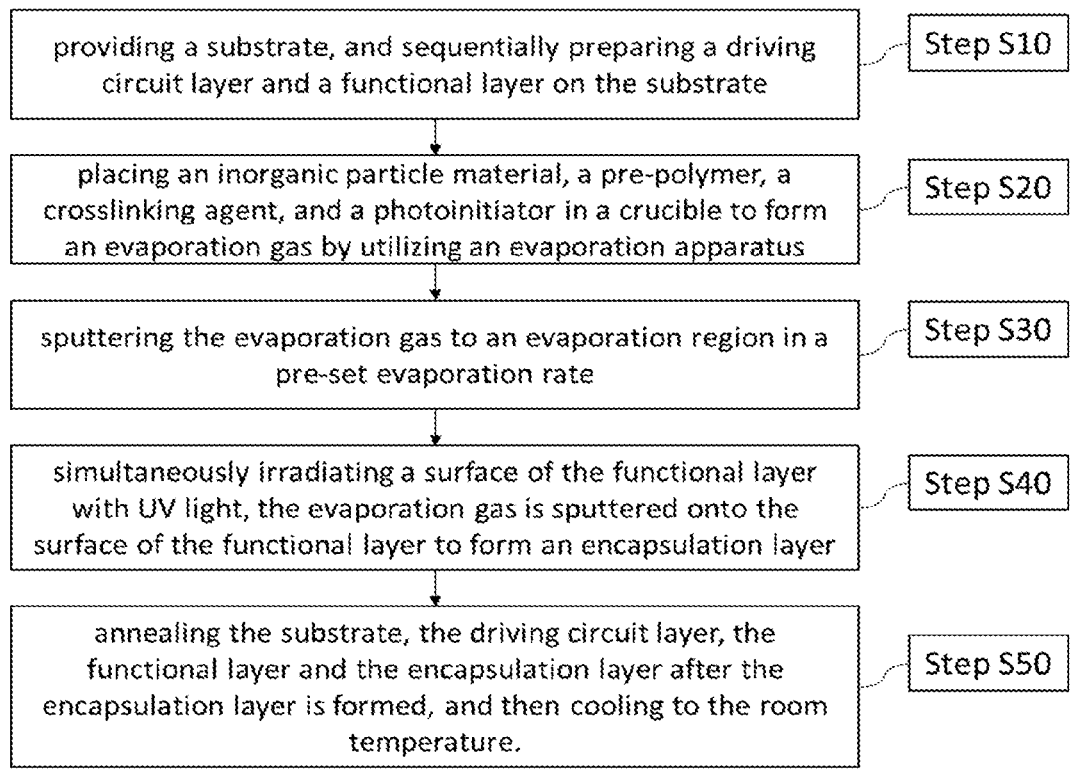
FIG. 4 is a schematic flowchart of manufacture of an encapsulation layer in an OLED display panel according to an embodiment of the present application.

According to the above-mentioned OLED display panel, a manufacturing method of an OLED display panel is provided. As shown in FIG. 4, the method includes:

A step S10 of providing a substrate, and sequentially preparing a driving circuit layer and a functional layer on the substrate.

A step S20 of placing an inorganic particle material, a pre-polymer, a crosslinking agent, and a photoinitiator in a crucible to form an evaporation gas by utilizing an evaporation apparatus.

A step S30 of sputtering the evaporation gas to an evaporation region in a pre-set evaporation rate.

A step S40 of simultaneously irradiating a surface of the functional layer with a light beam, wherein the evaporation gas is sputtered onto the surface of the functional layer to form an encapsulation layer.

A step S50 of annealing the substrate, the driving circuit layer, the functional layer and the encapsulation layer after the encapsulation layer is formed, and then cooling to the room temperature.

Preferably, the pre-polymer is one or more selected from a group consisting of vinyl chloride, propylene, and styrene.

Preferably, the crosslinking agent includes N,N'-methylenebisacrylamide.

Preferably, the photoinitiator is one or more selected from a group consisting of a BASF photoinitiator, benzophenone, and 2-butanone acid.

Preferably, the pre-polymer is polymerized under conditions of the crosslinking agent, the photoinitiator, an ultraviolet light, a high temperature and a high pressure to form a pre-polymer polymer.

Preferably, the encapsulation layer includes a uniformly distributed inorganic particle material and a pre-polymer polymer. In the embodiment of the present application, the encapsulation layer further includes the pre-polymer, the crosslinking agent, and the photoinitiator.

Preferably, the step S20 of placing the inorganic particle material, the pre-polymer, the crosslinking agent, and the photoinitiator in the crucible to form the evaporation gas by utilizing the evaporation apparatus specifically includes:

A step of separately placing the inorganic particle material, the pre-polymer, the crosslinking agent and the photoinitiator in four crucibles to form four evaporation gases. In the embodiment of the present application, the inorganic particle material and the pre-polymer are respectively placed in two middle crucibles, and the crosslinking agent and the photoinitiator are respectively placed in two crucibles. The embodiment of the present application is not limited to four crucibles, and may further be provided with more crucibles, the inorganic particle material, the pre-polymer, the crosslinking agent and the photoinitiator are alternately disposed in a plurality of crucibles, and the adjacent crucibles contain different material.

Preferably, the step S30 of sputtering the evaporation gas to the evaporation region in the pre-set evaporation rate specifically includes:

a step of setting a preset evaporation rate ratio of the inorganic particle material and the pre-polymer ranging from 1:5 to 1:1000; a step of setting a preset evaporation rate ratio of the photoinitiator and the pre-polymer ranging from 1:8 to 1:25; and a step of setting a preset evaporation rate ratio of the crosslinking agent and the pre-polymer ranging from 1:10 to 1:50. In this embodiment, in the condition that the inorganic particle material, the pre-polymer, the crosslinking agent and the photoinitiator are respectively placed in four crucibles to form four evaporation gases, and the encapsulation layer stability and transmittance are optimized by adjusting the evaporation rate of the organic material and the inorganic nanoparticle material, so as to achieve a highly uniform mixing of the inorganic nanoparticles and the organic material, thereby obtaining an integrally formed encapsulation layer.

Preferably, the step S20 of placing the inorganic particle material, the pre-polymer, the crosslinking agent, and the photoinitiator in the crucible to form the evaporation gas by utilizing the evaporation apparatus specifically includes:

a step of placing the inorganic particle material, the pre-polymer, the crosslinking agent, and the photoinitiator in one crucible to form a mixed evaporation gas. The present embodiment is not limited to only one crucible, and a plurality of crucibles may be provided. Each of the crucibles contains the inorganic particle material, the pre-polymer, the crosslinking agent, and the photoinitiator.

Preferably, the step S40 of simultaneously irradiating the surface of the functional layer with the light beam, wherein the evaporation gas is sputtered onto the surface of the functional layer to form the encapsulation layer specifically includes:

selecting the light beam from one or more of a group consisting of ultraviolet light, near-infrared light, and visible light, wherein the light beam catalyzes a polymerization reaction of the pre-polymer which is then cured to form the encapsulation layer.

Preferably, the step S50 of annealing the substrate, the driving circuit layer, the functional layer and the encapsulation layer after the encapsulation layer is formed, and then cooling to the room temperature specifically includes:

a step of setting an annealing treatment temperature ranging from 50 to 80° C., and an annealing time ranging from 2 to 10 minutes. The annealing treatment in this embodiment allows the preparation of the OLED display panel to release stress, and increase its extensibility and toughness.

Preferably, the step S30 of sputtering the evaporation gas to the evaporation region in the pre-set evaporation rate specifically includes:

a step of evaporating the evaporation gases of the inorganic particle material, the pre-polymer, the crosslinking agent, and the photoinitiator to a same evaporation region. In order to uniformly mix materials in the encapsulating film layer, the evaporation gases of the inorganic particle material, the pre-polymer, the crosslinking agent, and the photoinitiator are evaporated to a same evaporation region, and the evaporation gases cross each other to be uniformly mixed during the sputtering process of the four evaporation gases.

Preferably, a length of the functional layer is smaller than a length of the driving circuit layer, and the encapsulation layer covers the functional layer and a surface of the driving circuit layer adjacent to the functional layer. If the length of the functional layer is equal to the length of the driving circuit layer, the ends thereof are flush, and the encapsulation layer only covers the surface of the functional layer.

In the present application, by using an evaporation apparatus, an organic material and an inorganic nano-particle material are respectively placed in different crucibles to form a high-pressure gas, and are uniformly mixed during evaporation to a functional layer, preventing increase in a viscosity of organic material solution due to addition of the inorganic nanoparticles, thereby improving the quality of the encapsulation layer formation. A surface of the functional layer is irradiated with a light beam, the high-pressure gas forms an encapsulation layer immediately when the high-pressure gas is sprayed onto the surface of the functional layer, and the encapsulation layer stability and transmittance are optimized by adjusting the evaporation rate ratio of the organic material to the inorganic nanoparticle material. The encapsulation layer is formed integrally into one-piece, and the inorganic nanoparticles are uniformly distributed. Organic polymer is present between adjacent inorganic nanoparticles to achieve uniform distribution of the inorganic nano-material. A refractive index of the inorganic nano-particle material is higher than a refractive index of the organic material, so that a light transmittance of the OLED display panel is improved.

In view of above, although the present application has been disclosed in the above preferred embodiments, the preferred embodiments are not intended to limit the application, and those skilled in the art can make various modifications without departing from the spirit and scope of the application. The invention is modified and retouched, and the scope of protection of the present application is determined by the scope defined by the claims.

The invention claimed is:

1. A manufacturing method of an organic light emitting diode (OLED) display panel, comprising:
   a step S10 of providing a substrate, and sequentially preparing a driving circuit layer and a functional layer on the substrate;
   a step S20 of placing an inorganic particle material, a pre-polymer, a crosslinking agent, and a photoinitiator in a crucible to form an evaporation gas by utilizing an evaporation apparatus;
   a step S30 of sputtering the evaporation gas to an evaporation region in a pre-set evaporation rate;
   a step S40 of simultaneously irradiating a surface of the functional layer with a light beam, wherein the evaporation gas is sputtered onto the surface of the functional layer to form an encapsulation layer; and
   a step S50 of annealing the substrate, the driving circuit layer, the functional layer and the encapsulation layer after the encapsulation layer is formed, and then cooling to the room temperature.

2. The manufacturing method of the OLED display panel according to claim 1, wherein the pre-polymer is one or more selected from a group consisting of vinyl chloride, propylene, and styrene.

3. The manufacturing method of the OLED display panel according to claim 1, wherein the crosslinking agent comprises N,N'-methylenebisacrylamide.

4. The manufacturing method of the OLED display panel according to claim 1, wherein the photoinitiator is one or more selected from a group consisting of a BASF photoinitiator, benzophenone, and 2-butanone acid.

5. The manufacturing method of the OLED display panel according to claim 1, wherein the pre-polymer is polymerized under conditions of the crosslinking agent, the photoinitiator, an ultraviolet light, a high temperature and a high pressure to form a pre-polymer polymer.

6. The manufacturing method of the OLED display panel according to claim 1, wherein the encapsulation layer comprises a uniformly distributed inorganic particle material and a pre-polymer polymer.

7. The manufacturing method of the OLED display panel according to claim 1, wherein the step S20 of placing the inorganic particle material, the pre-polymer, the crosslinking agent, and the photoinitiator in the crucible to form the evaporation gas by utilizing the evaporation apparatus specifically comprises:

separately placing the inorganic particle material, the pre-polymer, the crosslinking agent and the photoinitiator in four crucibles to form four evaporation gases.

8. The manufacturing method of the OLED display panel according to claim 1, wherein the step S30 of sputtering the evaporation gas to the evaporation region in the pre-set evaporation rate specifically comprises:

setting a preset evaporation rate ratio of the inorganic particle material and the pre-polymer ranging from 1:5 to 1:1000;

setting a preset evaporation rate ratio of the photoinitiator and the pre-polymer ranging from 1:8 to 1:25; and setting a preset evaporation rate ratio of the crosslinking agent and the pre-polymer ranging from 1:10 to 1:50.

9. The manufacturing method of the OLED display panel according to claim 1, wherein the step S20 of placing the inorganic particle material, the pre-polymer, the crosslinking agent, and the photoinitiator in the crucible to form the evaporation gas by utilizing the evaporation apparatus specifically comprises:

placing the inorganic particle material, the pre-polymer, the crosslinking agent, and the photoinitiator in one crucible to form a mixed evaporation gas.

10. The manufacturing method of the OLED display panel according to claim 1, wherein the step S30 of sputtering the evaporation gas to the evaporation region in the pre-set evaporation rate specifically comprises:

evaporating evaporation gases of the inorganic particle material, the pre-polymer, the crosslinking agent, and the photoinitiator to a same evaporation region.

11. The manufacturing method of the OLED display panel according to claim 1, wherein the step S40 of simultaneously irradiating the surface of the functional layer with the light beam, wherein the evaporation gas is sputtered onto the surface of the functional layer to form the encapsulation layer specifically comprises:

selecting the light beam from one or more of a group consisting of ultraviolet light, near-infrared light, and visible light, wherein the light beam catalyzes a polymerization reaction of the pre-polymer which is then cured to form the encapsulation layer.

12. The manufacturing method of the OLED display panel according to claim 1, wherein the step S50 of annealing the substrate, the driving circuit layer, the functional layer and the encapsulation layer after the encapsulation layer is formed, and then cooling to the room temperature specifically comprises:

setting an annealing treatment temperature ranging from 50 to 80° C., and an annealing time ranging from 2 to 10 minutes.

13. The manufacturing method of the OLED display panel according to claim 1, wherein a length of the functional layer is smaller than a length of the driving circuit layer, and the encapsulation layer covers the functional layer and a surface of the driving circuit layer adjacent to the functional layer.

* * * * *